United States Patent [19]

Smith

[11] Patent Number: 4,528,511

[45] Date of Patent: Jul. 9, 1985

[54] CIRCUIT FOR DIGITAL FM DEMODULATION

[75] Inventor: Robert Smith, Meyrin, Switzerland

[73] Assignee: ITT Industries, Inc., New York, N.Y.

[21] Appl. No.: 554,206

[22] Filed: Nov. 22, 1983

[30] Foreign Application Priority Data

Nov. 26, 1982 [EP] European Pat. Off. ........ 82110945.1

[51] Int. Cl.$^3$ .............................................. H03D 3/00
[52] U.S. Cl. ...................................... 329/50; 329/126; 329/137; 329/145; 375/82; 455/214; 455/337
[58] Field of Search ................. 329/50, 126, 145, 137; 375/82; 455/214, 337

[56] References Cited

U.S. PATENT DOCUMENTS

| 3,135,917 | 6/1964 | Best et al. ........................ 329/137 X |
| 4,333,060 | 6/1982 | Mosley et al. ..................... 331/23 X |
| 4,393,352 | 6/1983 | Volpe et al. ..................... 329/145 X |
| 4,455,533 | 6/1984 | Moraillon ....................... 329/145 X |

FOREIGN PATENT DOCUMENTS

| 3145919 | 5/1983 | Fed. Rep. of Germany ...... 329/110 |
| 3212054 | 10/1983 | Fed. Rep. of Germany ...... 329/110 |
| 140705 | 11/1981 | Japan ................................. 329/110 |

Primary Examiner—Eugene R. Laroche
Assistant Examiner—D. C. Mis
Attorney, Agent, or Firm—Donald J. Lenkszus

[57] ABSTRACT

A digital FM demodulation circuit provides improved resolution by selecting from a group of at least four of the most recent samples, a subgroup of three samples. The first and last samples of the selected subgroup are summed and the sum is divided by the intermediate sample.

16 Claims, 2 Drawing Figures

CIRCUIT FOR DIGITAL FM DEMODULATION

BACKGROUND OF THE INVENTION

This invention pertains to a digital FM demodulation circuit in general. More specifically, the invention pertains to a circuit for the digital FM demodulation of temporarily equidistant samples derived from an analog frequency-modulated signal by way of sampling with the aid of a sampling signal. The samples are fed to the input of a chain of two series-arranged delay stages each having a delay equal to the period of the sampling signal. The samples are coupled to the first input of an adder whose second input is coupled to the output of the last delay stage. The output of the adder is connected to the dividend input of a divider which has its divisor input coupled to the output of the first delay stage. The divider output signal is used either directly or after forming the corresponding inverse sign values to provide a demodulated digital signal.

One such circuit is known from the German Offenlegungsschrift No. DE 30 30 853 A1. In this publication it is stated as a general principle that the digital FM demodulation can be achieved by a corresponding interconnection of three samples. However, more specifically the digital FM demodulation is obtained from three successively following samples as follows: the first and the third sample are added and divided by the second sample. Implementing this principle in circuitry leads to the circuit described above.

As is well known from the sampling theorem, the sampling frequency must be at least twice as high as the highest frequency existing in the signal to be sampled. To demonstrate a disadvantage of the conventional circuit, reference is first made to the special case in which the frequency of the sampling signal is just four times as high as the frequency of the signal to be sampled, and the signal frequency is frequency-modulated in the usual way. In that case, the sign of the first sample is opposite to that of the associated third sample of three successively following (adjacent) samples. In addition the amounts of both the first and the third sample are practically identical. This implies that the sum formed from these two samples results in small a numerical value lying around the zero point which, to provide sufficient resolution, requires a correspondingly high number of digits in the associated digital signals and therefore in the corresponding digital words. This property of the conventional circuit is of importance especially in cases where the first and the third sample are obtained adjacent to the positive and the negative peak value of the signal to be sampled.

SUMMARY OF THE INVENTION

It is one object of the invention to modify the conventional circuit in such a way that the resolution, in the case of a constant, given number of digits of the samples, is independent of the temporal position of the samples with respect to the sampled signal.

According to the invention, this is accomplished in that four, in the most simple case, successively following or adjacent samples (sampling values) are evaluated in such a way that a particular group of three samples contained in the group of four samples is applied to the adder and to the divider to yield the best resolution. Relative thereto, the arrangement is made in such a way that the particular group of three whose first and third samples are in the vicinity of the greates slope of the signal to be sampled is selected. In the case of samples of a purely sinusoidal signal, the selected three samples would be the values in the vicinity of the zero crossover. To select the respective group of three, a comparator and bus switches are used.

In accordance with a further embodiment of the invention, the resolution can be still further improved by not evaluating adjacent samples (sampling values), but rather by evaluating the first one in a long sequence of samples, then two adjacent ones following after an even number of skipped samples, and the last sample (sampling value) of the sequence again following after the same number of skipped samples.

An advantage of the invention is that a circuit for digital FM demodulation can be realized at a given resolution with a constant number of digits in particular of the adder.

BRIEF DESCRIPTION OF THE DRAWINGS

The invention may be better understood from a reading of the following detailed description in conjunction with the drawings in which.

DETAILED DESCRIPTION

Figure 1:
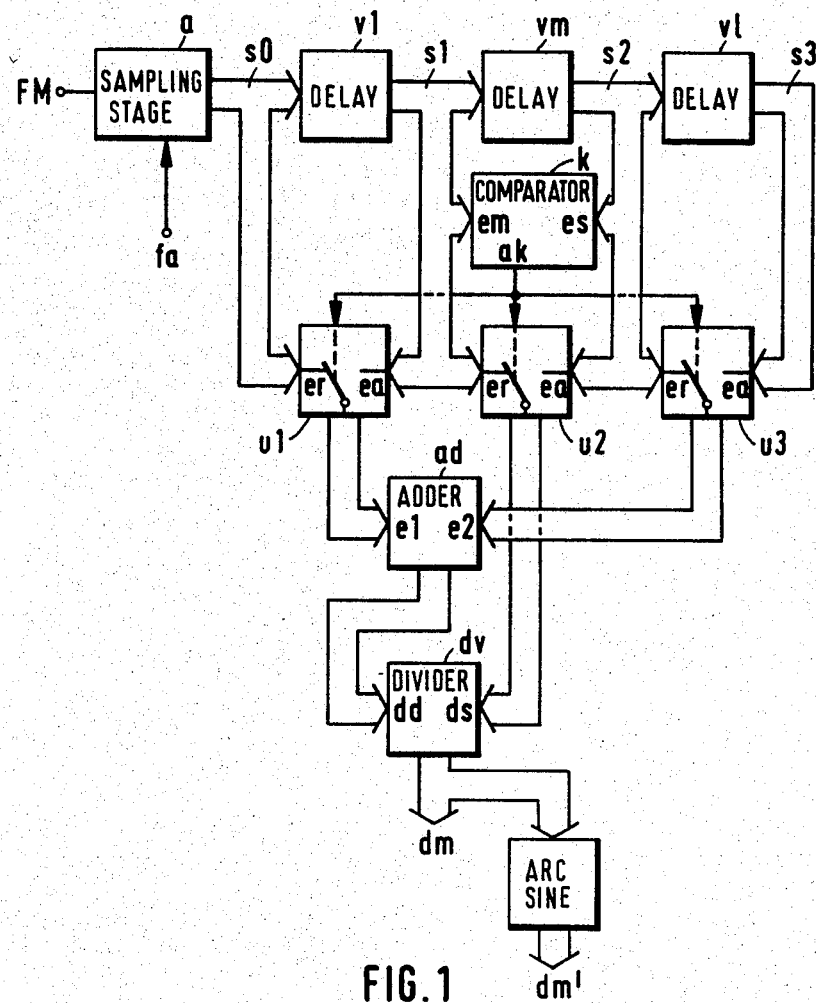
FIG. 1 is a schematic block diagram of an FM demodulator in accordance with the invention.

In the circuit of FIG. 1, the analog frequency-modulated signal FM to be demodulated is applied to the input side of the sampling stage a which is controlled by the sampling signal fa and which, at its output, provides temporarily equidistant sampling values in the form of corresponding digital signals or words. The tape or ribbon-shaped connecting lines extending between the individual partial circuits in FIG. 1 are indicative of the parallel signal processing as employed by the invention. Accordingly, each tape-shaped connecting line indicates a number of parallel lines commonly also referred to as a bus. Compared with the merely two delay stages proposed according to the aforementioned German reference, which corresponds to the first and last delay stages v1, vl in FIG. 1, there is provided, according to the invention, at least one further delay stage vm in the middle, which is of the same kind. Accordingly, the chain of delay stages contains an odd number of stages through which the sampling values are passed.

The input signal of the middle one of the delay stages vm is applied to the minuend input em of a comparator k. The output of delay stage vm is applied to the subtrahend input es of the comparator k. The respective inputs of the first, middle and last delay stages v1, vm, vl are applied to the respective rest contact input er of first, second and third bus switches u1, u2, u3. The respective control input of the three bus switches is connected to the minuend-greater-subtrahend-output ak of the comparator k. If, in the case of the presumed positive logic, the more positive level H of two binary levels H, L appears at output ak, i.e., when the signal at the input em of the comparator k is greater than the one at the input es, then the three bus switches u1, u2, u3 are in the positions as shown, that is, the input signals of the delay stages v1, v2, vl are through-connected by the respective bus switches u1, u2, u3. If, on the other hand, the output ak of the comparator k is a logic low or L-level, the bus switches u1, u2, u3 switch over to the respective operating contact eu, and the output signals of the three delay stages vl, vm, vl applied to the associated operating contact ea, and connected to the outputs of the respective bus switches u1, u2, u3.

To graphically represent the bus switches u1, u2, u3, the symbol of a mechanical switch is shown. It is evident that each bus switch consists of such a number of individual electronic switches which corresponds to the number of individual lines of the aforementioned buses.

The output of the first bus switch u1 and the output of the third bus switch u3 are connected to the first and the second inputs e1, e2 of an adder ad, respectively. The output of the second bus switch u2 is connected to the divisor input ds of a divider dv, and the output of the adder ad is connected to the dividend input dd of the divider dv. The output signal dm of divider dv serves directly as a demodulated digital signal, or can be fed to a stage for forming the corresponding arc sine values, with the output signal thereof then serving as the demodulated digital signal.

Thus, in the arrangement of FIG. 1, out of a sequence of four adjacent or, subsequently following samples, a group of three adjacent samples is selected in which the middle one of the three, has the highest value compared with the two adjacent ones. It is thereby assumed that the first and the last sample (sampling value) of the thus selected group of three, are within the area of the greatest slope of the signal to be sampled, and the resolution is optimized.

Figure 2:
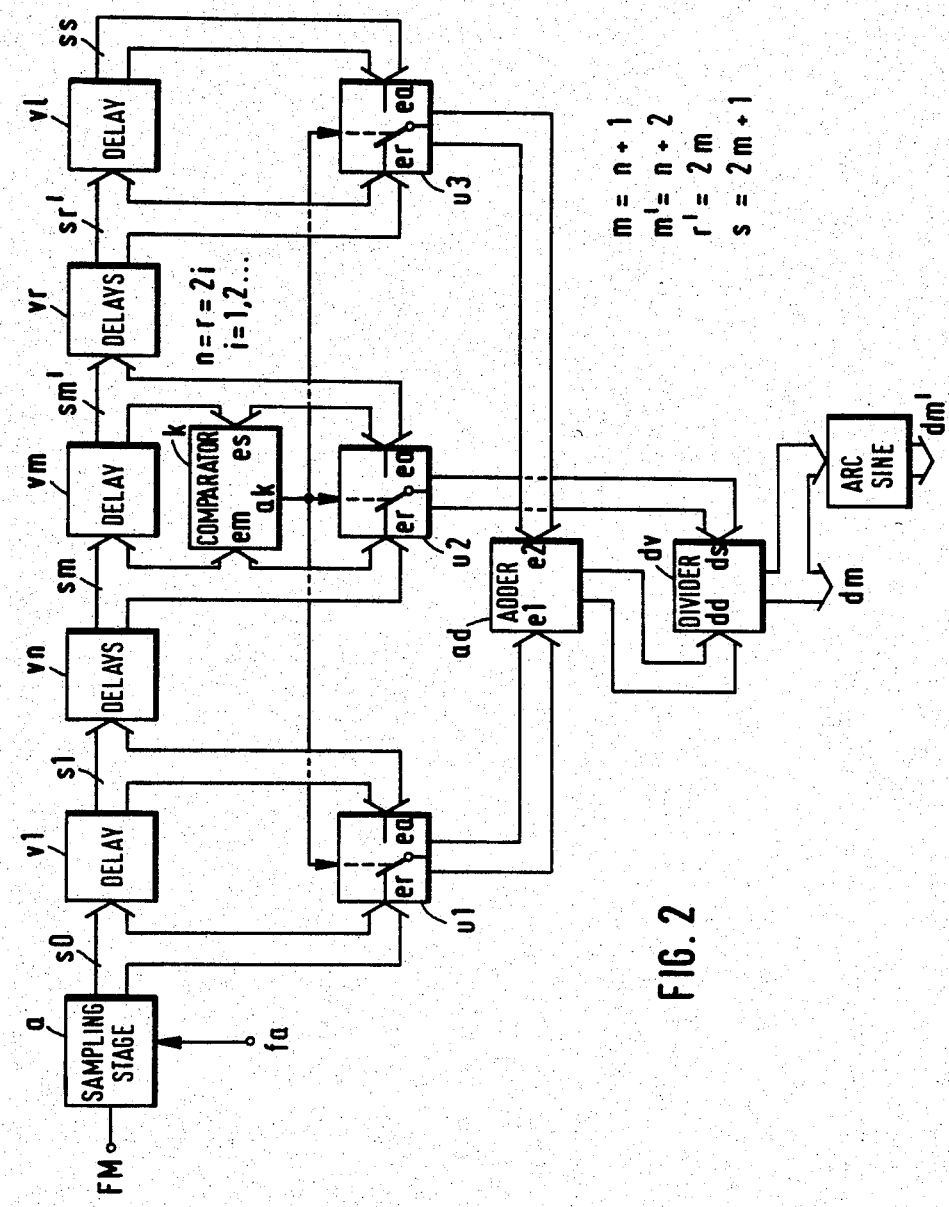
FIG. 2 is a schematic block diagram of a second embodiment of an FM demodulation in accordance with the invention.

FIG. 2 shows a further embodiment of the arrangement in accordance with the invention in which it is possible to obtain a further improvement of the resolution. In the arrangement of FIG. 2, three samples of a long sequence of sampling values are processed each time, with an even number of adjacent sampling values between the first and the middle one, as well as between middle one and the last sampling value not being used. In the circuit diagram of FIG. 2, an equal even numbers n and r of additional delay stages vn and vr are respectively inserted before and after the middle delay stage vm. These additional delay stages are inserted such that the additional delay stages vn are arranged between the operating contact input ea of the first bus switch u1 and the rest contact input er of the second bus switch u2, and the additional delay stages vr are arranged between the operating contact input ea of the second bus switch u2 and the rest contact input er of the third bus switch u3.

As in the arrangement of FIG. 1, three bus switches u1, u2, u3 are utilized to select the inputs to adder ad and the divisor input ds of the divider dv. A comparator k is likewise utilized to control the bus switches u1, u2 u3. The respective inputs of the first, middle and last delay stages vl, vm and vl, respectively are applied to the respective rest contact input er of the first, second and third bus switch u1, u2 u3. The respective outputs of the first, middle and last delay stages vl, vm and vl, respectively, are applied to the respective operating contact input ea of the first, second and third bus switch u1, u2, u3. Th input sm of delay stage um is coupled to the minuend input em of comparator k. The output sm' of delay stage vm is coupled to the subtrahend input es of comparator k. The comparator output ak is connected to the control inputs of the bus switches u1, u2, u3.

When sm is greater than sm', the output signal at ak will be an H level and the bus switches will be in the position shown. Adder ad then adds the samples so and sr' providing the sum to the dd input ot divider dv. The sum is divided by the sample sm which is coupled to the divisor input ds.

When sm is not greater than sm' adder ad adds samples sl and ss which divider dv divides by sample sm'.

Turning back to FIG. 1, when the digital signals at the inputs or outputs of the three delay stages vl, vm, vl are indicated by s0, s1, s2, s3, then the output signal dm of the divider dv, in the shown position of the bus switches u1,u2, u3, can be written as follows:

$$dm = -F(s0+s2)/\pi s1 \text{ or}$$

$$dm = -(2F/\pi) \arcsin (s0+s2)/2s1,$$

with F indicating the carrier frequency of the analog frequency-modulated signal FM.

To the arrangement as shown in FIG. 2, there applies a corresponding formula:

$$dm = (-1)^{(m+1)/2} F(s0+sr')\pi msm.$$

By way of example for digital FM demodulation of SECAM television signals preferably six additional delay stages are inserted into the chain of delay stages for vn and a like number vr.

For this example, the following numerical values apply to the individual indices:

$$m=7, r'=14, s=15.$$

In this particular case, the following will result as the output signal of the divider:

$$dm = F(s0+s14)/7\pi s7.$$

What is claimed is:

1. A demodulation circuit for frequency modulated (FM) signals comprising:
   first means for receiving an analog FM signal and for periodically generating at a predetermined sampling rate samples of said analog FM signal in digital signal representation;
   means for comparing a first sample of from at least four sequentially occuring ones of said samples with a second sample of said at least four sequentially occuring samples;
   means responsive to said comparing means for selecting a group of samples from said at least four sequentially occuring samples, said selected group comprising a first group of three samples when said first sample has a first predetermined relationship to said second sample and said selected group comprising a second group of three samples when said first sample has a second predetermined relationship to said second sample; and
   means for generating digital signal representations of the demodulated FM signal by utilizing said selected group of samples.

2. A demodulation circuit in accordance with claim 1, wherein said generating means comprises:
   means for adding a first sample of said selected group to a second sample of said selected group and providing a sum output; and
   means for dividing said sum by a third sample of said selected group.

3. A demodulation circuit in accordance with claim 2, wherein said generating means further comprises:

means coupled to the output of said dividing means for forming digital output signals representing the arc sine of the output of said dividing means.

4. A demodulation circuit in accordance with claim 1 comprising a plurality of serially connected delay stages coupled to the output of said sampling means, each of said delay stages delaying said samples by a period of time determined by said sampling rate; and wherein the outputs of said serially connected delay stages supply at least a portion of said at least four sequentially occuring samples.

5. A demodulation circuit in accordance with claim 4, wherein said plurality of serially connected delay stages comprises an odd number of delay stages.

6. A demodulation circuit in accordance with claim 5, wherein the input to a first one of said delay stages supplies one of said at least four sequentially occuring samples.

7. A demodulation circuit in accordance with claim 5, wherein said first and said second samples are the middle two samples of said at least four sequentially occuring samples, and said first sample being the more recent one of said first and said second samples.

8. A demodulation circuit in accordance with claim 7, wherein said first group of said samples comprises the most recent sample of said at least four sequentially occuring samples, said first sample, and the next to the last oldest sample of said at least four sequentially occuring samples; and wherein said second group of said samples comprises the second most recent sample of said at least four sequentially occuring samples, said second sample, and the oldest sample of said at least four sequentially occuring samples.

9. A demodulation circuit in accordance with claim 1, wherein said generating means comprises means for generating a first demodulated FM signal representative of the sum of a first sample of said selected group and a second sample of said selected group, said sum being divided by a third sample of said selected group.

10. A demodulation circuit in accordance with claim 9, wherein said generating means further comprises means for receiving said first demodulated FM signal and generating a second demodulated FM signal by forming an inverse trignometric function of said first demodulated FM signal.

11. A demodulation circuit in accordance with claim 10, wherein said inverse trignometric function is the arc sine.

12. A demodulation circuit for providing digital output signals representative of a demodulated analog FM signal from samples of said analog FM signal, where each of said samples is a digital signal representation, said samples occuring at a predetermined rate, said circuit comprising:

means for comparing a first sample from a group of sequentially occuring samples to a second sample from said group;

means responsive to said comparing means for selecting a subgroup of samples from said group; and means for generating said digital output signals from said selected subgroup.

13. A demodulation circuit in accordance with claim 12, wherein said generating means comprises means for generating first digital output signals representative of the sum of two samples of said subgroup divided by a third sample of said subgroup.

14. A circuit for the digital FM demodulation of temporally equidistant samples derived from an analog frequency modulated (FM) signal by way of sampling with the aid of a sampling signal, said circuit comprising:

a chain of serially connected delay stages for receiving said sample, said chain comprising a first delay stage, a middle delay stage and a third delay stage, each delay stage delaying said samples by the period of said sampling signal;

a comparator having a minuend input coupled to the input of said middle stage, a subtrahend input coupled to the output of said middle stage, and an output;

first, second, and third switching means each having first and second inputs, an output and a control input, said control input of all of said switching means being coupled to said comparator output, said first inputs of said first, second, and third switching means being coupled to the inputs of said first, middle and third delay stages, respectively, said second inputs of said first, second and third switching means being coupled to the outputs of said first, middle, and third switching means, respectively;

an adder having a first input coupled to said first switching means output, a second input coupled to said third switching means output, and a sum output;

a divider having a dividend input coupled to said sum output, and a divisor input coupled to said third switch means output, and an output for providing a digital demodulated signal output.

15. A circuit in accordance with claim 14 comprising:

an even number of first additional delay stages serially connected between said first and said middle delay stages; and an even number of second additional delay stages serially connected between said middle and said third delay stages.

16. A circuit in accordance with claim 15 adapted for use with SECAM television signals wherein, said even number of said first additional delay stages provides a delay of six times said period; and said even number of said second additional delay stages provides a delay of six times said period.

* * * * *